(12) United States Patent
Huang

(10) Patent No.: US 12,092,654 B2
(45) Date of Patent: Sep. 17, 2024

(54) ASSEMBLY FOR CARRYING CHIP, AND DEVICE AND METHOD FOR TESTING CHIP

(71) Applicant: CHANGXIN MEMORY TECHNOLOGIES, INC., Hefei (CN)

(72) Inventor: Jinrong Huang, Hefei (CN)

(73) Assignee: Changxin Memory Technologies, Inc., Hefei (CN)

( * ) Notice: Subject to any disclaimer, the term of this patent is extended or adjusted under 35 U.S.C. 154(b) by 217 days.

(21) Appl. No.: 17/663,865

(22) Filed: May 18, 2022

(65) Prior Publication Data

US 2023/0003763 A1    Jan. 5, 2023

Related U.S. Application Data

(63) Continuation of application No. PCT/CN2021/127592, filed on Oct. 29, 2021.

(30) Foreign Application Priority Data

Jul. 1, 2021 (CN) .......................... 202110749241.6

(51) Int. Cl.
*G01R 1/04* (2006.01)
*G01R 1/02* (2006.01)
(Continued)

(52) U.S. Cl.
CPC ......... *G01R 1/0425* (2013.01); *G01R 1/0416* (2013.01); *G01R 31/2884* (2013.01); *G01R 31/2893* (2013.01); *G01R 31/2896* (2013.01)

(58) Field of Classification Search
CPC . G01R 1/02; G01R 1/04; G01R 1/067; G01R 1/073; G01R 31/02; G01R 31/20; G01R 31/28
See application file for complete search history.

(56) References Cited

U.S. PATENT DOCUMENTS 5,984,292 A    11/1999  Troha
2021/0172720 A1*  6/2021  Ichikura .................. G01B 7/30

FOREIGN PATENT DOCUMENTS

CN    106887885 A    6/2017
CN    208409236 U    1/2019
(Continued)

OTHER PUBLICATIONS

International Search Report cited in PCT/CN2021/127592 mailed Mar. 30, 2022, 10 pages.

*Primary Examiner* — Neel D Shah
(74) *Attorney, Agent, or Firm* — Kilpatrick Townsend & Stockton LLP

(57) ABSTRACT

The present disclosure discloses an assembly for carrying a chip, and a device and a method for testing a chip. The assembly for carrying a chip is configured to fasten chips of different sizes, and includes a rotatable vertical rod, a cross beam, a first sidewall, and a second sidewall. The rotatable vertical rod is provided with a gear that surrounds the rotatable vertical rod with gear teeth. The cross beam is internally provided with a first through hole and a first chute. A top of the first sidewall is connected to a first connecting rod located in the first chute. A top of the second sidewall is connected to a second connecting rod located in the first chute. A side surface of the first connecting rod is provided with a plurality of first tooth grooves arranged linearly.

19 Claims, 4 Drawing Sheets

(51) Int. Cl.
*G01R 1/067* (2006.01)
*G01R 1/073* (2006.01)
*G01R 31/20* (2006.01)
*G01R 31/28* (2006.01)

(56) References Cited

FOREIGN PATENT DOCUMENTS

| | | |
|---|---|---|
| CN | 209280759 U | 8/2019 |
| CN | 210499965 U | 5/2020 |
| CN | 213340348 U | 6/2021 |

\* cited by examiner

ASSEMBLY FOR CARRYING CHIP, AND DEVICE AND METHOD FOR TESTING CHIP

CROSS-REFERENCE TO RELATED APPLICATIONS

This is a continuation of International Application No. PCT/CN2021/127592, filed on Oct. 29, 2021, which claims the priority to Chinese Patent Application No. 202110749241.6, titled "ASSEMBLY FOR CARRYING CHIP, AND DEVICE AND METHOD FOR TESTING CHIP" and filed with China National Intellectual Property Administration (CNIPA) on Jul. 1, 2021. The entire contents of International Application No. PCT/CN2021/127592 and Chinese Patent Application No. 202110749241.6 are incorporated herein by reference.

TECHNICAL FIELD

The present disclosure relates to, but is not limited to, an assembly for carrying a chip, and a device and a method for testing a chip.

BACKGROUND

A chip die and different types of frames or molding compounds form a chip package body. There are many types of chip package bodies. Generally, the chip package bodies can be divided into different types according to packaging materials of the chip package bodies, connection manners of the chip package bodies and printed circuit boards (PCBs), and the appearances of the chip package bodies. The chip package bodies need to be tested before leaving the factory, so as to improve the quality of the supply.

In a process of testing a chip package body, a test pin thereof needs to be electrically connected to a test circuit. In order to facilitate the fixed connection between the test circuit and the chip package body, a carrier device meeting a test requirement of the chip package body needs to be provided, to provide a test electrical signal to the chip package body through the test circuit and the test pin of the chip package body fastened to the carrier device, to test performance and reliability of the chip package body.

However, different types of chip package bodies have different dimensions, and chip package bodies of a same type may have different sizes of test pins. As a result, if matching carrier devices for testing are respectively provided for various types of chip package bodies, it will obviously cause a waste of resources, which increase test costs.

SUMMARY

An overview of the subject matter detailed in the present disclosure is provided below, which is not intended to limit the protection scope of the claims.

The present disclosure provides an assembly for carrying a chip, and a device and a method for testing a chip.

According to a first aspect of the present disclosure, an assembly for carrying a chip is provided. The assembly for carrying a chip is configured to fasten chips of different sizes, and includes a rotatable vertical rod, a cross beam, a first sidewall, and a second sidewall. The rotatable vertical rod is provided with a gear that surrounds the rotatable vertical rod with gear teeth. The cross beam is internally provided with a first through hole and a first chute, an extension direction of the first chute is consistent with an extension direction of the cross beam. A top of the first sidewall is connected to a first connecting rod located in the first chute. The second sidewall is spaced apart from the first sidewall and configured to fasten a chip located between the first sidewall and the second sidewall, and a top of the second sidewall is connected to a second connecting rod spaced apart from the first connecting rod and located in the first chute, and a side surface of the first connecting rod close to the second connecting rod is provided with a plurality of first tooth grooves arranged linearly. The rotatable vertical rod is configured to rotate in the first through hole and drive the gear to rotate, so that the gear teeth of the gear are engaged with the first tooth grooves, to drive the first sidewall to be relatively close to the second sidewall or relatively distant from the second sidewall.

According to a second aspect of the present disclosure, a device for testing a chip is provided. The device for testing a chip includes a support box and the assembly for carrying a chip described in any embodiment of the present disclosure. The support box is configured to carry a test circuit board. The assembly for carrying a chip is configured to fasten a chip to an upper surface of the test circuit board, and the test circuit board is configured to provide a test signal for the chip, to test the chip.

According to a third aspect of the present disclosure, a method for testing a chip is provided, including:
  loading a chip into the assembly for carrying a chip described in any embodiment of the present disclosure and fastening the chip;
  making a connecting terminal of the chip in contact with an upper surface of a test circuit board located in a support box, and rotating the rotatable vertical rod until a bottom surface of the rotatable vertical rod is in contact with a top surface of the chip; and
  controlling the test circuit board to provide a test signal for the chip, to test the chip.

Other aspects of the present disclosure are understandable upon reading and understanding of the accompanying drawings and detailed description.

BRIEF DESCRIPTION OF THE DRAWINGS

To better describe and illustrate the embodiments and/or examples of the applications disclosed herein, reference may be made to one or more accompanying drawings. Additional details or examples for describing the drawings should not be considered as limitations on the scope of any one of the disclosed applications, the currently described embodiment and/or example, and the optimal mode of the applications as currently understood.

DETAILED DESCRIPTION

To facilitate the understanding of the present disclosure, the present disclosure is described more completely below with reference to the related accompanying drawings. The preferred embodiments of the present disclosure are shown in the accompanying drawings. However, the present disclosure may be embodied in various forms without being limited to the embodiments described herein. On the contrary, these embodiments are provided to make the present disclosure more thorough and comprehensive.

Unless otherwise defined, all technical and scientific terms used herein have the same meaning as commonly understood by those skilled in the technical field of the present disclosure. The terms used in the specification of the present disclosure are merely for the purpose of describing specific embodiments, rather than to limit the present disclosure.

In a case that terms "include", "have", and "contain" in the specification are used, unless clear qualifiers such as "only" and "consist of" are used, another component can be added. Unless the contrary is mentioned, terms in the singular form may include the plural form but are not to be understood as a single one.

In the present disclosure, unless otherwise clearly specified, the terms "installation", "interconnection", "connection" and "fixation" are intended to be understood in a broad sense. For example, the connection may be a fixed connection, removable connection or integral connection; may be a mechanical connection or electrical connection; may be a direct connection or indirect connection using a medium; and may be a communication or interaction between two elements. A person of ordinary skill in the art may understand specific meanings of the foregoing terms in the present disclosure based on a specific situation.

Spatial relationship terms such as "under", "beneath", "lower", "below", "above", and "upper" can be used herein to conveniently describe the relationship shown in the figure between one element or feature and another element or feature. It should be understood that in addition to the orientations shown in the figure, the spatial relationship terms are intended to further include different orientations of used and operated devices. For example, if a device in the accompanying drawings is turned over, a device or feature described as being "beneath another element", "below it", or "under it" is oriented "on" another element or feature. Therefore, the exemplary terms "beneath" and "under" may include two orientations of above and below. The device may be otherwise oriented (rotated by 90 degrees or other orientations), and the spatial description used herein is interpreted accordingly. The orientation term "on" in the present disclosure is from the user's viewing angle.

Figure 1:
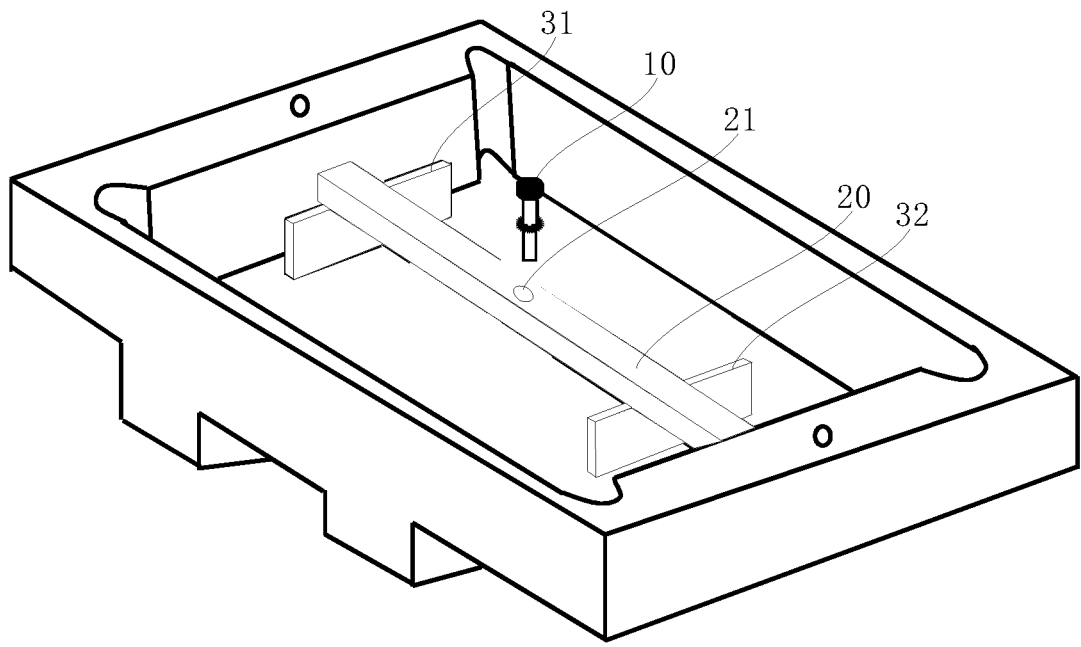
FIG. 1 is a schematic structural diagram of an assembly for carrying a chip provided in one embodiment of the present disclosure.
Figure 2:
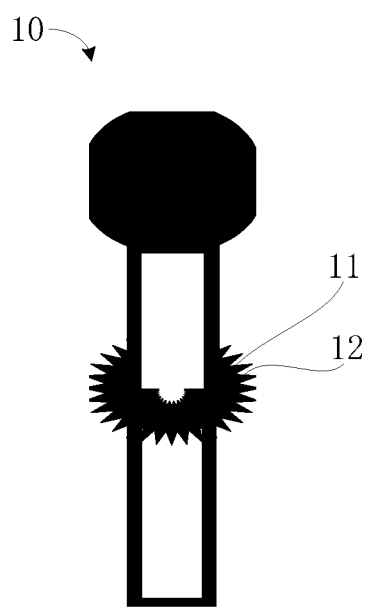
FIG. 2 is a schematic structural diagram of a rotatable vertical rod in one embodiment shown in FIG. 1.
Figure 3:
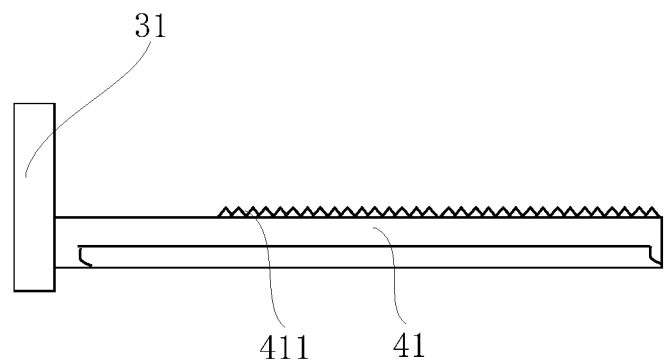
FIG. 3 is a top view of a first sidewall and a first connecting rod in one embodiment shown in FIG. 1.

With reference to FIG. 1, FIG. 2, and FIG. 3, one embodiment of the present disclosure provides an assembly for carrying a chip. The assembly for carrying a chip is configured to fasten chips of different sizes (not shown in FIG. 1 and FIG. 2), and includes a rotatable vertical rod 10, a cross beam 20, a first sidewall 31, and a second sidewall 32. The rotatable vertical rod 10 is provided with a gear 11 that surrounds the rotatable vertical rod 10 with gear teeth 12. The cross beam 20 is internally provided with a first through hole 21 and a first chute (not shown in FIG. 1), and an extension direction of the first chute is consistent with an extension direction of the cross beam 20. A top of the first sidewall 31 is connected to a first connecting rod 41 located in the first chute. The second sidewall 32 is spaced apart from the first sidewall 31 and configured to fasten a chip located between the first sidewall 31 and the second sidewall 32, and a top of the second sidewall 32 is connected to a second connecting rod 42 (refer to FIG. 4A) spaced apart from the first connecting rod 41 and located in the first chute, and the side surface of the first connecting rod 41 close to the second connecting rod 42 is provided with a plurality of first tooth grooves 411 arranged linearly. The rotatable vertical rod 10 is configured to rotate in the first through hole 21 and drive the gear 11 to rotate, so that the gear teeth 12 of the gear 11 are engaged with the first tooth grooves 411 to drive the first sidewall 31 to be relatively close to the second sidewall 32 or relatively distant from the second sidewall 32.

With reference to FIG. 1, FIG. 2, and FIG. 3, the rotatable vertical rod 10 is provided with a gear 11 that surrounds the rotatable vertical rod 10 with gear teeth 12, the cross beam 20 is internally provided with a first through hole 21 and a first chute (not shown in FIG. 1), and an extension direction of the first chute is consistent with an extension direction of the cross beam 20. The top of the first sidewall 31 is connected to a first connecting rod 41 located in the first chute, and the top of the second sidewall 32 spaced apart from the first sidewall 31 is connected to a second connecting rod 42 (refer to FIG. 4A). The second connecting rod 42 is spaced apart from the first connecting rod 41 and located in the first chute, and the side surface of the first connecting rod 41 close to the second connecting rod 42 is provided with a plurality of first tooth grooves 411 arranged linearly. Through a mechanical principle that when the gear 11 is rotated, the gear teeth 12 are engaged with tooth grooves formed in a body to drive the body to act, the rotatable vertical rod 10 rotatably passing through the first through hole 21 in the cross beam 20 drives the gear 11 on the rotatable vertical rod 10 to rotate, so that the gear teeth 12 of the gear 11 are engaged with the first tooth grooves 411 on the first connecting rod 41 to drive the first sidewall 31 to be relatively close to the second sidewall 32 or relatively distant from the second sidewall 32. A distance between the first sidewall 31 and the second sidewall 32 is adjusted to fasten a chip between the two, thereby meeting fastening requirements of chips of different types, different shapes, and different volumes, and reducing test costs for various types of chips while improving chip test efficiency.

With reference to FIG. 1, FIG. 2, and FIG. 3, in one embodiment of the present disclosure, the gear 11 is arranged in the middle of the rotatable vertical rod 10; and a bottom surface of the rotatable vertical rod 10 is configured to be in contact with a top surface of the chip, to fasten the chip in a direction perpendicular to the top surface of the chip, thereby improving the chip fastening stability.

With reference to FIG. 1, FIG. 2, and FIG. 3, in one embodiment of the present disclosure, the bottom surface of the rotatable vertical rod 10 is provided with an elastic body (not shown in the figures), and the elastic body is configured to be in elastic contact with the top surface of the chip, thereby avoiding crushing the chip while improving the chip fastening stability.

With reference to FIG. 1, FIG. 2, and FIG. 3, in one embodiment of the present disclosure, the top of the rotatable vertical rod 10 is provided with a handle, which is convenient for rotating the rotatable vertical rod 10 by holding the handle in hand.

Figure 4A:
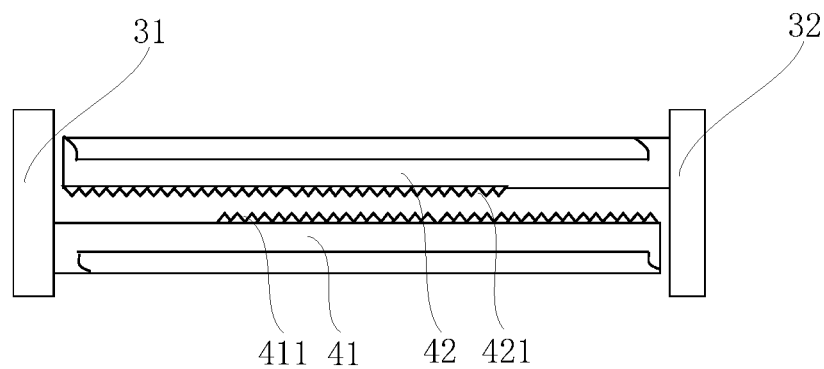
FIG. 4A is a top view of a first sidewall, a first connecting rod, a second sidewall, and a second connecting rod in another embodiment shown in FIG. 1.
Figure 4B:
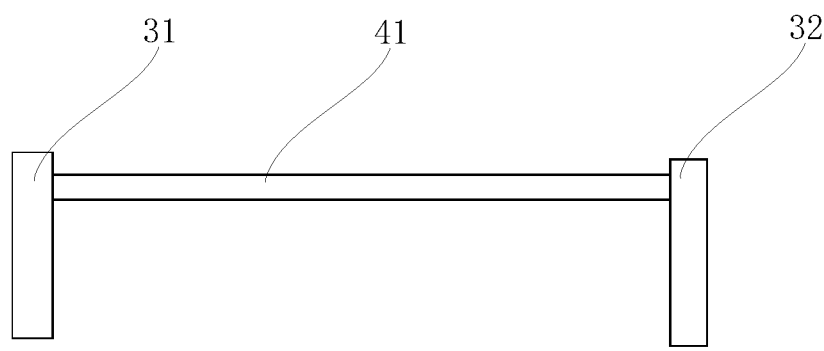
FIG. 4B is a front view of a first sidewall and a first connecting rod in one embodiment shown in FIG. 1.

With reference to FIG. 4A and FIG. 4B, in one embodiment of the present disclosure, the side surface of the second connecting rod 42 close to the first connecting rod 41 is provided with a plurality of second tooth grooves 421 arranged linearly; and the gear teeth 12 of the gear 11 are further configured to be engaged with the second tooth grooves 421 to drive the second sidewall 32 to be relatively close to the first sidewall 31 or relatively distant from the first sidewall 31. In this embodiment, the rotatable vertical rod 10 rotatably passing through the first through hole 21 in the cross beam 20 drives the gear 11 on the rotatable vertical rod 10 to rotate, so that the gear teeth 12 of the gear 11 are engaged with the second tooth grooves 421 on the second connecting rod 42 to drive the second sidewall 32 to be relatively close to the first sidewall 31 or relatively distant from the first sidewall 31. A distance between the first sidewall 31 and the second sidewall 32 is adjusted to fasten a chip between the two, thereby meeting fastening requirements of chips of different types, different shapes, and different volumes, and reducing test costs for various types of chips while improving chip test efficiency.

With reference to FIG. 4A and FIG. 4B, in one embodiment of the present disclosure, an extension direction of the first tooth grooves 411 is consistent with an extension direction of the second tooth grooves 421. The gear 11 is further configured to rotate between the first tooth groove 411 and the second tooth groove 421, so that the gear teeth 12 of the gear 11 are engaged with the first tooth grooves 411 and the second tooth grooves 421 at the same time, to simultaneously drive the first connecting rod 41 and the second connecting rod 42 to move and simultaneously drive the first sidewall 31 and the second sidewall 32 to be relatively close to each other or relatively distant from each other. The first connecting rod 41 and the second connecting rod 42 can be driven to move at the same time when the rotatable vertical rod 10 rotatably passes through the first through hole 21 in the cross beam 20, thereby improving the efficiency of adjusting the distance between the first sidewall 31 and the second sidewall 32.

With reference to FIG. 4A and FIG. 4B, in one embodiment of the present disclosure, the surface of the first sidewall 31 close to the second sidewall 32 is provided with an anti-slip material (not shown in the figures), and the surface of the second sidewall 32 close to the first sidewall 31 is also provided with an anti-slip material. The anti-slip material may include anti-slip sand, or rubberized anti-slip fibers, or the like, and is configured to increase a frictional force between the chip between the first sidewall 31 and the second sidewall 32 and either the first sidewall 31 or the second sidewall 32, thereby improving the chip fastening stability.

Figure 5:
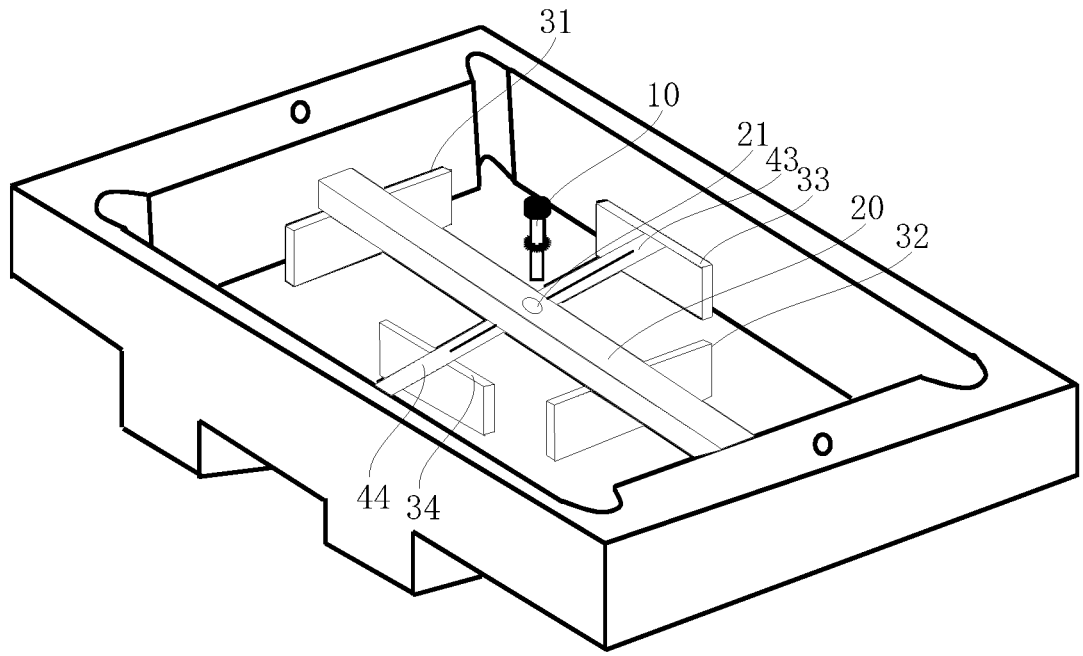
FIG. 5 is a schematic structural diagram of an assembly for carrying a chip provided in another embodiment of the present disclosure.
Figure 6A:
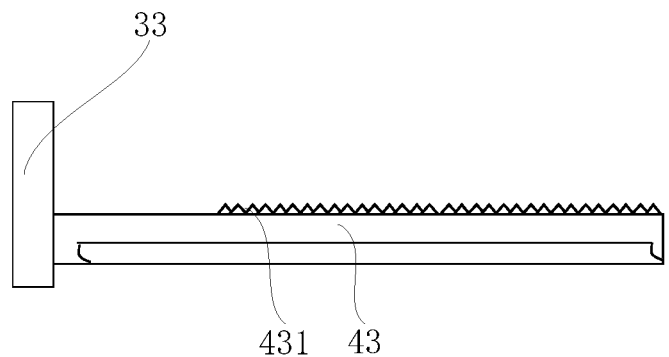
FIG. 6A is a top view of a third sidewall and a third connecting rod in one embodiment shown in FIG. 5.

With reference to FIG. 5 and FIG. 6A, in one embodiment of the present disclosure, the assembly for carrying chip further includes a third sidewall 33 and a fourth sidewall 34. The top of the third sidewall 33 is connected to a third connecting rod 43, and the third connecting rod 43 passes through the cross beam 20 and the first through hole 21 through a second chute (not shown in FIG. 5) formed in the cross beam 20. The fourth sidewall 34 is spaced apart from the third sidewall 33 and configured to fasten a chip located between the third sidewall 33 and the fourth sidewall 34, and the top of the fourth sidewall 34 is connected to a fourth connecting rod 44 spaced apart from the third connecting rod 43 and located in the second chute, and the side surface of the third connecting rod 43 close to the fourth connecting rod 44 is provided with a plurality of third tooth grooves 431 arranged linearly. The rotatable vertical rod 10 is configured to rotate in the first through hole 21 and drive the gear 11 to rotate, so that the gear teeth 12 of the gear 11 are engaged with the third tooth grooves 431 to drive the third sidewall 33 to be relatively close to the fourth sidewall 34 or relatively distant from the fourth sidewall 34.

With reference to FIG. 5 and FIG. 6A, through a mechanical principle that when the gear 11 is rotated, the gear teeth 12 are engaged with tooth grooves formed in a body to drive the body to act, the rotatable vertical rod 10 rotatably passing through the first through hole 21 in the cross beam 20 drives the gear 11 on the rotatable vertical rod 10 to rotate, so that the gear teeth 12 of the gear 11 are engaged with the third tooth grooves 431 on the third connecting rod 43 to drive the third sidewall 33 to be relatively close to the fourth sidewall 34 or relatively distant from the fourth sidewall 34. A distance between the third sidewall 33 and the fourth sidewall 34 is adjusted to fasten a chip between the two, thereby meeting fastening requirements of chips of different types, different shapes, and different volumes, and reducing test costs for various types of chips while improving chip test efficiency.

Figure 6B:
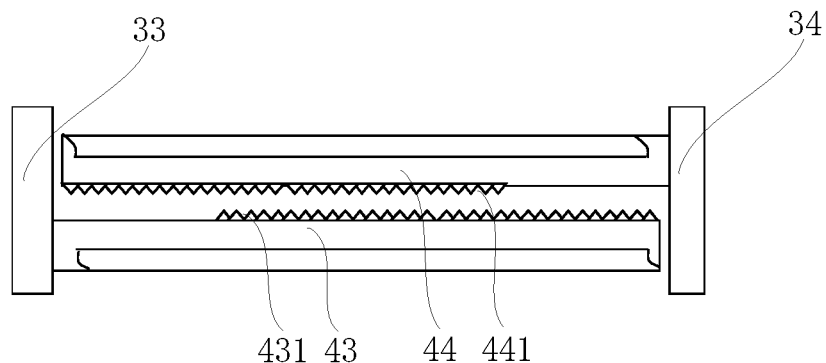
FIG. 6B is a top view of a third sidewall, a third connecting rod, a fourth sidewall, and a fourth connecting rod in another embodiment shown in FIG. 5.
Figure 6C:
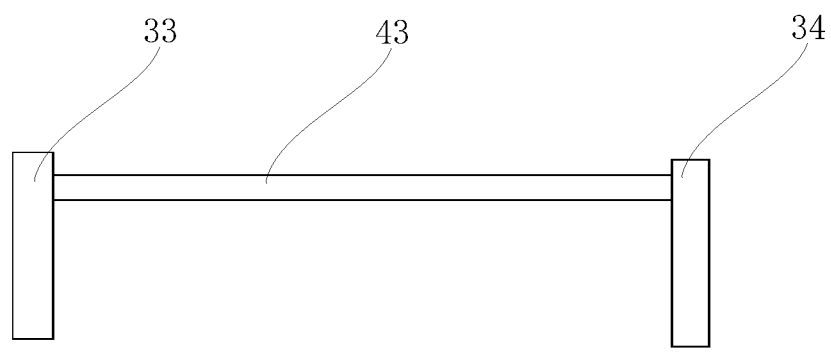
FIG. 6C is a right view of a third sidewall and a third connecting rod in one embodiment shown in FIG. 5.
Figure 6D:
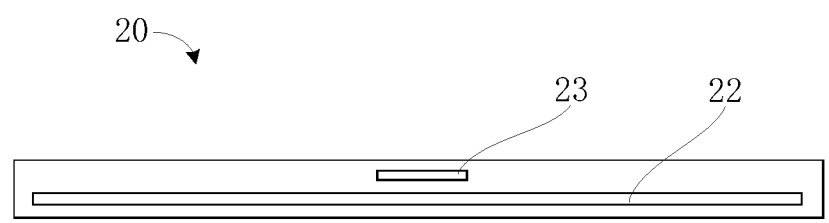
FIG. 6D is a front view of a cross beam in one embodiment shown in FIG. 5.

With reference to FIG. 5, FIG. 6B, and FIG. 6C, in one embodiment of the present disclosure, the side surface of the fourth connecting rod 44 close to the third connecting rod 43 is provided with a plurality of fourth tooth grooves 441 arranged linearly; and the gear teeth 12 of the gear 11 are further configured to be engaged with the fourth tooth grooves 441 to drive the fourth sidewall 34 to be relatively close to the third sidewall 33 or relatively distant from the third sidewall 33. In this embodiment, the rotatable vertical rod 10 rotatably passing through the first through hole 21 in the cross beam 20 drives the gear 11 on the rotatable vertical rod 10 to rotate, so that the gear teeth 12 of the gear 11 are engaged with the fourth tooth grooves 441 on the fourth connecting rod 44 to drive the fourth sidewall 34 to be relatively close to the third sidewall 33 or relatively distant from the third sidewall 33. A distance between the third sidewall 33 and the fourth sidewall 34 is adjusted to fasten a chip between the two, thereby meeting fastening requirements of chips of different types, different shapes, and different volumes, and reducing test costs for various types of chips while improving chip test efficiency.

With reference to FIG. 5, FIG. 6B, and FIG. 6C, in one embodiment of the present disclosure, an extension direction of the fourth tooth grooves 441 is consistent with an extension direction of the third tooth grooves 431. The gear 11 is further configured to rotate between the third tooth groove 431 and the fourth tooth groove 441, so that the gear teeth 12 of the gear 11 are engaged with the third tooth grooves 431 and the fourth tooth grooves 441 at the same time, to simultaneously drive the third sidewall 33 and the fourth sidewall 34 to be relatively close to each other or relatively distant from each other. The third connecting rod 43 and the fourth connecting rod 44 can be driven to move at the same time when the rotatable vertical rod 10 rotatably passes through the first through hole 21 in the cross beam 20, thereby improving the efficiency of adjusting the distance between the third sidewall 33 and the fourth sidewall 34.

With reference to FIG. 5, FIG. 6B, FIG. 6C, and FIG. 6D, in one embodiment of the present disclosure, the second chute 23 is spaced apart from the first chute 22, so that the rotatable vertical rod 10 rotatably passing through the first through hole 21 in the cross beam 20 is enabled to drive the gear 11 to move from the inside of the first chute 22 to the inside of the second chute 23, so as to adjust the distance between the third sidewall 33 and the fourth sidewall 34.

With reference to FIG. 5, FIG. 6A, FIG. 6B, FIG. 6C, and FIG. 6D, in one embodiment of the present disclosure, the extension direction of the second chute 23 is oblique to the extension direction of the first chute 22, for example, perpendicular, so as to improve the chip fastening stability.

With reference to FIG. 5, FIG. 6A, FIG. 6B, FIG. 6C, and FIG. 6D, in one embodiment of the present disclosure, the surface of the third sidewall 33 close to the fourth sidewall 34 is provided with an anti-slip material, and the surface of the fourth sidewall 34 close to the third sidewall 33 is also provided with an anti-slip material (not shown in the figures), so as to increase a frictional force between the chip between the third sidewall 33 and the fourth sidewall 34 and either the third sidewall 33 or the fourth sidewall 34, thereby improving the chip fastening stability. The anti-slip material may include anti-slip sand, or rubberized anti-slip fibers, or the like.

The present disclosure also provides a device for testing a chip, including a support box and the assembly for carrying a chip described in any embodiment of the present disclosure. The support box is configured to carry a test circuit board. The assembly for carrying a chip is configured to fasten a chip to an upper surface of the test circuit board, and the test circuit board is configured to provide a test signal for the chip to test the chip. The device for testing a chip in this embodiment can test chips of different types, different shapes, and different volumes without replacing the assembly for carrying a chip, thereby reducing test costs for various types of chips while improving chip test efficiency.

The present disclosure also provides a method for testing a chip, including:
loading a chip into the assembly for carrying a chip described in any embodiment of the present disclosure and fastening the chip;
making a connecting terminal of the chip in contact with an upper surface of a test circuit board located in a support box, and rotating a rotatable vertical rod until a bottom surface of the rotatable vertical rod is in contact with a top surface of the chip; and
controlling the test circuit board to provide a test signal for the chip to test the chip.

The method for testing a chip in the foregoing embodiment can test chips of different types, different shapes, and different volumes without replacing the assembly for carrying a chip, thereby reducing test costs for various types of chips while improving chip test efficiency.

For specific limitations of the method for testing a chip in the foregoing embodiment, reference may be made to the limitations of the assembly for carrying a chip above.

It should be noted that the foregoing embodiments are merely for the purpose of description instead of limiting the present disclosure.

The embodiments of this specification are described in a progressive manner, and each embodiment focuses on differences from other embodiments. The same or similar parts between the embodiments may refer to each other.

The technical characteristics of the above embodiments can be employed in arbitrary combinations. In an effort to provide a concise description of these embodiments, all possible combinations of all technical characteristics of the embodiments may not be described; however, these combinations of technical characteristics should be construed as disclosed in the specification as long as no contradiction occurs.

The above described are merely several embodiments of the present disclosure. Although these embodiments are described specifically and in detail, they should not be construed as a limitation to the patent scope of the present disclosure. It should be noted that those of ordinary skill in the art may further make variations and improvements without departing from the concept of the present disclosure. These variations and improvements should fall within the protection scope of the present disclosure. Therefore, the protection scope of the present disclosure should be subject to the protection scope defined by the claims.

INDUSTRIAL APPLICABILITY

The assembly for carrying a chip disclosed in the present disclosure can fasten chips of different types, different shapes, and different volumes, thereby reducing test costs for various types of chips while improving chip test efficiency.

The invention claimed is:
1. An assembly for carrying a chip, configured to fasten chips of different sizes, and comprising:
a rotatable vertical rod, provided with a gear that surrounds the rotatable vertical rod with gear teeth;
a cross beam, internally provided with a first through hole and a first chute, an extension direction of the first chute being consistent with an extension direction of the cross beam;
a first sidewall, a top of the first sidewall being connected to a first connecting rod located in the first chute; and
a second sidewall, spaced apart from the first sidewall, and configured to fasten a chip between the first sidewall and the second sidewall, a top of the second sidewall being connected to a second connecting rod spaced apart from the first connecting rod and located in the first chute, and a side surface of the first connecting rod close to the second connecting rod being provided with a plurality of first tooth grooves arranged linearly; and,
wherein the rotatable vertical rod is configured to rotate in the first through hole and drive the gear to rotate, so that the gear teeth of the gear are engaged with the first tooth grooves, to drive the first sidewall to be relatively close to the second sidewall or relatively distant from the second sidewall; and the assembly further comprises
a third sidewall, a top of the third sidewall being connected to a third connecting rod, the third connecting rod passing through the cross beam and the first through hole through a second chute formed in the cross beam; and
a fourth sidewall, spaced apart from the third sidewall, and configured to fasten a chip between the third sidewall and the fourth sidewall, a top of the fourth sidewall being connected to a fourth connecting rod spaced apart from the third connecting rod and located in the second chute, and a side surface of the third connecting rod close to the fourth connecting rod being provided with a plurality of third tooth grooves arranged linearly, wherein the rotatable vertical rod is configured to rotate in the first through hole and drive the gear to rotate, so that the gear teeth of the gear are engaged with the third tooth grooves, to drive the third sidewall to be relatively close to the fourth sidewall or relatively distant from the fourth sidewall.

2. The assembly for carrying a chip according to claim 1, wherein
a side surface of the second connecting rod close to the first connecting rod is provided with a plurality of second tooth grooves arranged linearly; and
the gear teeth of the gear are further configured to be engaged with the second tooth grooves, to drive the second sidewall to be relatively close to the first sidewall or relatively distant from the first sidewall.

3. The assembly for carrying a chip according to claim 2, wherein
an extension direction of the first tooth grooves is consistent with an extension direction of the second tooth grooves; and
the gear is further configured to rotate between the first tooth grooves and the second tooth grooves, so that the gear teeth of the gear are engaged with the first tooth grooves and the second tooth grooves at the same time, to simultaneously drive the first sidewall and the second sidewall to be relatively close to each other or relatively distant from each other.

4. The assembly for carrying a chip according to claim 1, wherein
a surface of the first sidewall close to the second sidewall is provided with an anti-slip material; and
a surface of the second sidewall close to the first sidewall is also provided with an anti-slip material.

5. The assembly for carrying a chip according to claim 1, wherein
a side surface of the fourth connecting rod close to the third connecting rod is provided with a plurality of fourth tooth grooves arranged linearly; and
the gear teeth of the gear are further configured to be engaged with the fourth tooth grooves, to drive the fourth sidewall to be relatively close to the third sidewall or relatively distant from the third sidewall.

6. The assembly for carrying a chip according to claim 5, wherein
an extension direction of the fourth tooth grooves is consistent with an extension direction of the third tooth grooves; and
the gear is further configured to rotate between the third tooth grooves and the fourth tooth grooves, so that the gear teeth of the gear are engaged with the third tooth grooves and the fourth tooth grooves at the same time, to simultaneously drive the third sidewall and the fourth sidewall to be relatively close to each other or relatively distant from each other.

7. The assembly for carrying a chip according to claim 6, wherein
the second chute is spaced apart from the first chute.

8. The assembly for carrying a chip according to claim 6, wherein
an extension direction of the second chute is perpendicular to the extension direction of the first chute.

9. The assembly for carrying a chip according to claim 6, wherein
a surface of the third sidewall close to the fourth sidewall is provided with an anti-slip material; and
a surface of the fourth sidewall close to the third sidewall is also provided with an anti-slip material.

10. The assembly for carrying a chip according to claim 1, wherein
the gear is arranged in a middle of the rotatable vertical rod; and
a bottom surface of the rotatable vertical rod is configured to be in contact with a top surface of the chip.

11. The assembly for carrying a chip according to claim 10, wherein
the bottom surface of the rotatable vertical rod is provided with an elastic body, and the elastic body is configured to be in elastic contact with the top surface of the chip.

12. The assembly for carrying a chip according to claim 1, wherein
a top of the rotatable vertical rod is provided with a handle.

13. A device for testing a chip, comprising:
a support box, configured to carry a test circuit board; and
the assembly for carrying a chip according to claim 1, configured to fasten a chip to an upper surface of the test circuit board;
wherein the test circuit board is configured to provide a test signal for the chip, to test the chip.

14. A method for testing a chip, comprising:
loading a chip into the assembly for carrying a chip according to claim 1;
making a connecting terminal of the chip in contact with an upper surface of a test circuit board located in a support box, and rotating the rotatable vertical rod until a bottom surface of the rotatable vertical rod is in contact with a top surface of the chip; and
controlling the test circuit board to provide a test signal for the chip, to test the chip.

15. An assembly for carrying a chip, configured to fasten chips of different sizes, and comprising:
a rotatable vertical rod, provided with a gear that surrounds the rotatable vertical rod with gear teeth;
a cross beam, internally provided with a first through hole and a first chute, an extension direction of the first chute being consistent with an extension direction of the cross beam;
a first sidewall, a top of the first sidewall being connected to a first connecting rod located in the first chute; and
a second sidewall, spaced apart from the first sidewall, and configured to fasten a chip between the first sidewall and the second sidewall, a top of the second sidewall being connected to a second connecting rod spaced apart from the first connecting rod and located in the first chute, and a side surface of the first connecting rod close to the second connecting rod being provided with a plurality of first tooth grooves arranged linearly;
wherein the rotatable vertical rod is configured to rotate in the first through hole and drive the gear to rotate, so that the gear teeth of the gear are engaged with the first tooth grooves, to drive the first sidewall to be relatively close to the second sidewall or relatively distant from the second sidewall; wherein
the bottom surface of the rotatable vertical rod is provided with an elastic body, and the bottom surface of the rotatable vertical rod is provided with an elastic body, and the elastic body is configured to be in elastic contact with the top surface of the chip.

16. The assembly for carrying a chip according to claim 15, wherein
a side surface of the second connecting rod close to the first connecting rod is provided with a plurality of second tooth grooves arranged linearly; and
the gear teeth of the gear are further configured to be engaged with the second tooth grooves, to drive the second sidewall to be relatively close to the first sidewall or relatively distant from the first sidewall.

17. The assembly for carrying a chip according to claim 16, wherein an extension direction of the first tooth grooves is consistent with an extension direction of the second tooth grooves; and the gear is further configured to rotate between the first tooth grooves and the second tooth grooves, so that the gear teeth of the gear are engaged with the first tooth grooves and the second tooth grooves at the same time, to simultaneously drive the first sidewall and the second sidewall to be relatively close to each other or relatively distant from each other.

18. The assembly for carrying a chip according to claim 15, wherein a surface of the first sidewall close to the second sidewall is provided with an anti-slip material; and a surface of the second sidewall close to the first sidewall is also provided with an anti-slip material.

19. The assembly for carrying a chip according to claim 15, wherein a top of the rotatable vertical rod is provided with a handle.

\* \* \* \* \*